United States Patent
Tung

(10) Patent No.: US 6,392,274 B1
(45) Date of Patent: May 21, 2002

(54) HIGH-VOLTAGE METAL-OXIDE-SEMICONDUCTOR TRANSISTOR

(75) Inventor: Ming-Tsung Tung, Hsin-Chu (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 09/542,842

(22) Filed: Apr. 4, 2000

(51) Int. Cl.[7] .............................. H01L 29/76
(52) U.S. Cl. .............. 257/339; 257/335; 257/336
(58) Field of Search ..................... 257/335, 336, 257/339

(56) References Cited

U.S. PATENT DOCUMENTS

| | | | | |
|---|---|---|---|---|
| 4,007,478 A | * | 2/1977 | Yagi ............................. | 257/336 |
| 4,409,606 A | * | 10/1983 | Wagenaar et al. ........... | 257/334 |
| 4,639,761 A | * | 1/1987 | Singer et al. ................ | 257/336 |
| 5,256,893 A | * | 10/1993 | Yasuoka ...................... | 257/335 |
| 5,428,241 A | * | 6/1995 | Terashima ................... | 257/409 |
| 5,844,275 A | * | 12/1998 | Kitamura et al. ............ | 257/335 |
| 5,977,590 A | * | 11/1999 | Suzuki ......................... | 257/339 |
| 6,194,760 B1 | * | 2/2001 | Lee .............................. | 257/328 |
| 6,194,761 B1 | * | 2/2001 | Chiozzi et al. .............. | 257/328 |

FOREIGN PATENT DOCUMENTS

JP    3-57-211778   * 12/1982  ................. 257/339

* cited by examiner

Primary Examiner—Eddie Lee
Assistant Examiner—George C. Eckert, II
(74) Attorney, Agent, or Firm—Winston Hsu

(57) ABSTRACT

A method for fabricating an HVMOS transistor that can reduce snapback is disclosed. The semiconductor wafer comprises an N-type silicon substrate, and a P-type epitaxial layer formed on the surface of the silicon substrate. The HVMOS transistor comprises a first P-well region formed within the epitaxial layer, a second P-well region formed within the first P-well region a source region formed within the second P-well region, an N-drain region formed in the epitaxial layer, a gate, and an N-type diffused region formed both in the epitaxial layer and in the silicon substrate. The diffused region is under the first P-well region and overlaps the first P-well region.

19 Claims, 5 Drawing Sheets

HIGH-VOLTAGE METAL-OXIDE-SEMICONDUCTOR TRANSISTOR

BACKGROUND OF THE INVENTION

1. Field of the Invention

The present invention relates to the structure of a high-voltage metal-oxide-semiconductor (HVMOS) transistor and the method of making the same. More particularly, the invention relates to the structure of, and method of making, an HVMOS transistor that reduces snapback.

2. Description of the Prior Art

High-voltage metal-oxide-semiconductor (HVMOS) transistors are in wide use in many electric devices, such as CPU power supplies, power management systems, AC/DC converters, etc. Consequently, improving their operating characteristics is of considerable importance to electronics manufacturers.

Please refer to FIG. 1. FIG. 1 is cross-sectional diagram of an HVMOS transistor 30 according to the prior art. As shown in FIG. 1, the HVMOS transistor 30 is manufactured on a semiconductor wafer 10. The semiconductor wafer 10 comprises a P-type silicon substrate 11 and a P-type epitaxial layer 12 formed on the surface of the P-type silicon substrate 11. The HVMOS transistor 30 comprises a P-well region 21 formed in the P-type epitaxial layer 12, an N-type source 22 formed within the P-well region 21, an N-type drain 24 formed in the P-type epitaxial layer 12, and a gate 14.

When a voltage is applied to the drain 24, a depletion region, or a space-charge region that is depleted of holes and electrons but contains positively ionized donor atoms on one side and negatively ionized acceptor atoms on the other side, occurs. As the voltage applied to the drain 24 increases, both the width of the depletion region and the electric field in the region increase. When an electron in the depletion region is accelerated by the strong electric field caused by a large reverse bias, the electron, well-known as a hot electron, gains kinetic energy that is equal to, or greater than, the band gap energy of silicon. The hot electron collides with the lattice and breaks a covalent bond. The breaking of a covalent bond, which is equal to the elevation of an electron from the valence band to the conduction band, results in the generation of an electron-hole pair.

The two electrons, the original one and the one resulting from the collision, are in turn accelerated by the high electric field, gain kinetic energy greater than the gap energy, collide with the lattice, and generate two additional electron-hole pairs. These additional electrons will create more electrons in a chain reaction known as the carrier multiplication effect, and finally cause an avalanche breakdown resulting from impact ionization. The avalanche process of carrier generation by collision results in a very large number of carriers, and hence a large increase in the current.

Both electrons and holes take part in impact ionization. When the drain voltage is large, a substantial hole current $I_{sub}$ can flow to the substrate, and the product of $I_{sub}$ and the substrate resistance $R_{sub}$, i.e. the inductive voltage $V_b$, becomes large enough to forward-bias the source-substrate junction, causing electron injection into the substrate. This injection leads to a parasitic n-p-n (source-substrate-drain) bipolar transistor 40 effect.

The parasitic bipolar transistor 40 presents the problem of snapback. Snapback occurs when the parasitic bipolar transistor 40 is turned on by the large impact ionization hole current from the drain before the substrate-drain diode breaks down. When snapback occurs, the drain current increases very rapidly with only a miniscule voltage, causing damage to the HVMOS transistor. The minimum drain voltage at which snapback occurs, called the snapback voltage, decreases as the drain-substrate electric field increases. In addition, the channel conductance of the HVMOS transistor 30 according to the prior art method is insufficient and thus results in inferior current drifting capabilities.

SUMMARY OF THE INVENTION

It is therefore a primary objective of this invention to provide an improved structure of an HVMOS transistor to reduce the parasitic n-p-n bipolar transistor phenomenon, thereby alleviating snapback effects.

According to this invention, the HVMOS transistor is manufactured on a semiconductor wafer. The semiconductor wafer comprises a silicon substrate of a first conductivity type and an epitaxial layer of a second conductivity type formed on the surface of the silicon substrate. The HVMOS transistor comprises a first well region of the second conductivity type formed within the epitaxial layer, a second well region of the second conductivity type formed within the first well region, a source region of the first conductivity type formed within the second well region of the epitaxial layer, a drain region of the first conductivity type formed in the epitaxial layer, a gate located between the source region and the drain region on the surface of the epitaxial layer, and a diffused region of the second conductivity type formed both in the epitaxial layer and in the silicon substrate. The diffused region of the second conductivity type is under the first well region and overlaps the first well region.

According to one aspect of this invention, the structure of the HVMOS transistor provides a stronger lateral electric field along the channel resulting from the second well region of the second conductivity type, which results in higher channel conductance and better current drifting capabilities. Moreover, to reduce parasitic transistor effects, the resistance of the substrate $R_{sub}$ is minimized using the diffused region of the second conductivity type, which is under the first well region and overlaps with the first well region, ensuring that the inductive voltage $V_b$ remains smaller than the snapback voltage.

DETAILED DESCRIPTION OF THE PREFERRED EMBODIMENT

Figure 1:
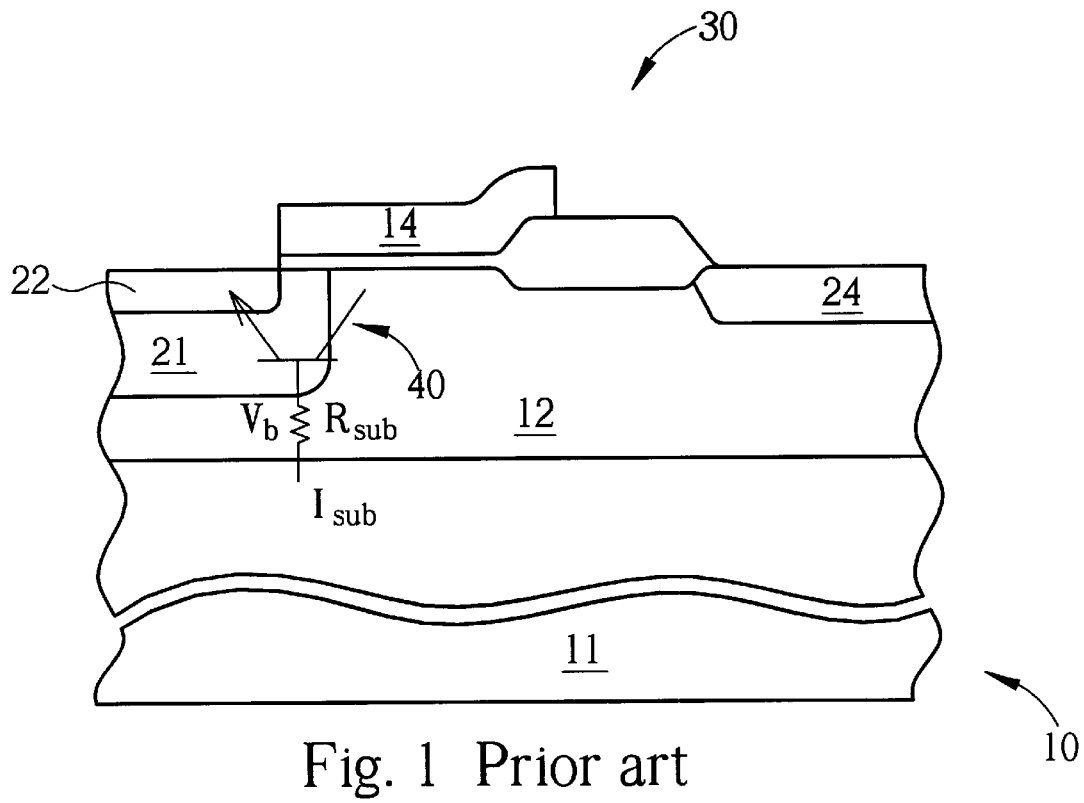
FIG. 1 is the cross-sectional diagram of an HVMOS transistor according to the prior art.
Figure 2:
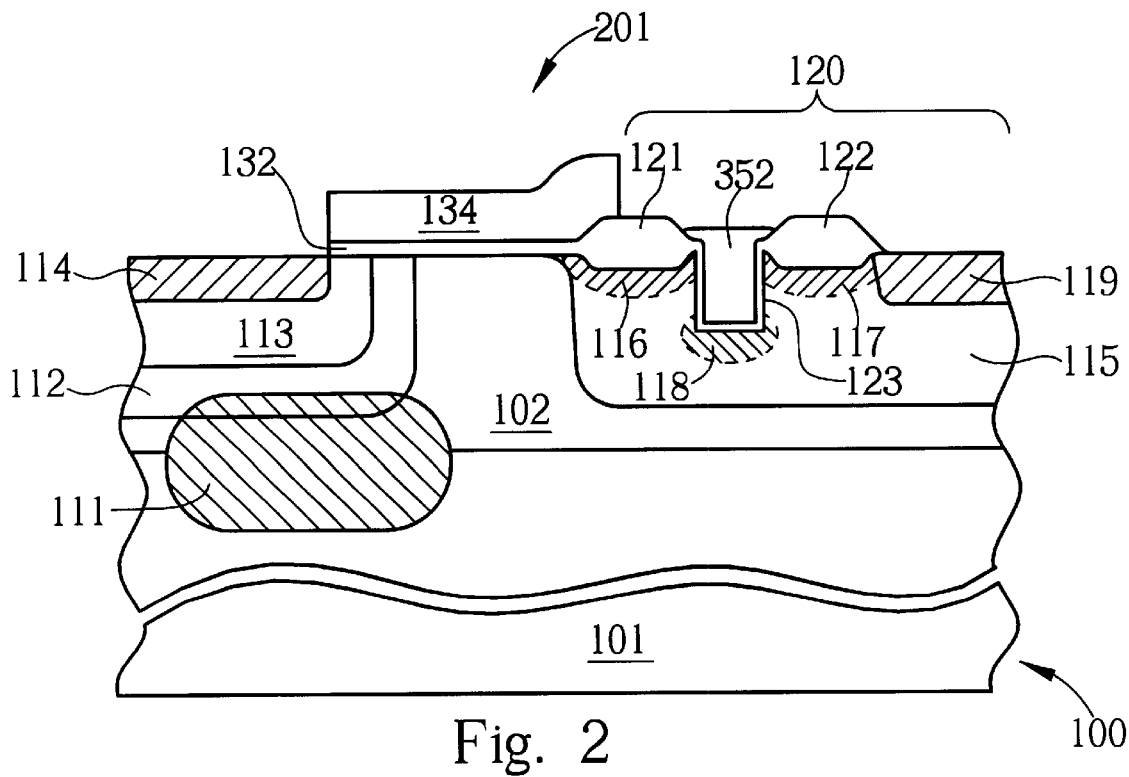
FIG. 2 is the cross-sectional diagram of an HVMOS transistor according to the present invention.

Please refer to FIG. 2. FIG. 2 is cross-sectional diagram of an HVMOS transistor 201 fabricated on a semiconductor wafer 100 according to the present invention. As shown in FIG. 2, the semiconductor wafer 100 comprises a silicon substrate 101 of a first conductivity type and an epitaxial layer 102 of a second conductivity type, which is formed on the surface of the silicon substrate 101. The HVMOS transistor 201 comprises a first well region 112 of the second conductivity type formed in the epitaxial layer 102, a second well region 113 of the second conductivity type formed within the first well region 112, a source region 114 formed within the second well region 113, a drain region 120 formed in the epitaxial layer 102, a gate 134 formed on the surface of the epitaxial layer 102 between the source region 132 and drain region 120, and a diffused region 111 of the second conductivity type formed both in the epitaxial layer 102 and in the silicon substrate 101. The diffused region of the second conductivity type is under the first well region and overlaps the first well region.

The first conductivity type and the second conductivity type are opposite conductivity types. Hereinafter, in the preferred embodiment according to the present invention, the first conductivity type is N-type, while the second conductivity type is P-type. It should be noted, however, that the opposite arrangement is also possible.

The drain region 120 comprises an N well 115 formed on the surface of the epitaxial layer 102, a first and a second field oxide layer 121 and 122 formed within the N-type drain well 115 on the surface of the epitaxial layer 102, a first and a second N-type doping region 116 and 117 respectively formed under the first and the second field oxide layers 121 and 122, a shallow trench 123 filled with a dielectric material, such as silicon dioxide, formed between the first and the second field oxide layers 121 and 122 on the surface of the epitaxial layer 102, a P-type doping region 118 formed under the shallow trench 123, and a third N-type doping region 119 formed within the N-type drain well 115 on the surface of the epitaxial layer 102. The doping regions 116 and 117 are contiguous with their respective field oxide layers 121 and 122, and the P-type doping region 118 is contiguous with the shallow trench 123. The third N-type doping region 119 is adjacent to the second field oxide layer 122.

Figure 3:
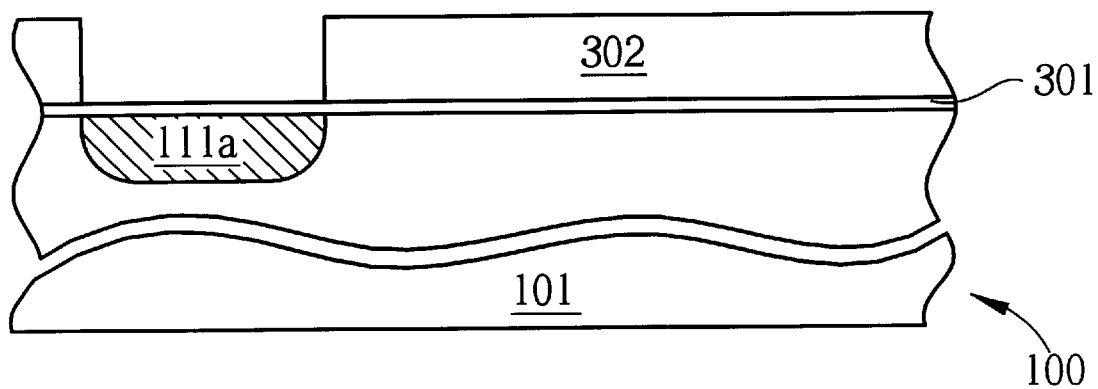
FIG. 3 to FIG. 10 are cross-sectional diagrams of a method of fabricating an HVMOS transistor according to the present invention.

Please refer to FIG. 3 to FIG. 10. FIG. 3 to FIG. 10 are cross-sectional diagrams of the method of fabricating the HVMOS transistor 201 on the semiconductor wafer 100 according to the present invention. As shown in FIG. 3, the semiconductor wafer 100 comprises an N-type silicon substrate 101 and a silicon oxide layer 301 formed on the surface of the silicon substrate 101. The silicon oxide layer 301 has a thickness of about 100 to 300 angstroms. Several approaches, such as a chemical vapor deposition (CVD) method or a thermal oxidation method, are commonly used to form the silicon oxide layer 301, which serves as a pad oxide layer in a subsequent ion implantation process.

A patterned photo-resist layer 302 is first formed on the surface of the silicon oxide layer 301 using standard lithographic methods. A P-type ion implantation process is then performed, using the photo-resist layer 302 as a hard mask, to form a doping region 111a on the surface of the silicon substrate 101. Boron, or boron fluoride ions ($BF_2^+$), with an energy of about 50 to 150 KeV and a dosage of about $1.0 \times 10^{14}$ to $1.0 \times 10^{15}$ atoms/cm$^2$ are usually used in the P-type ion implantation process.

Figure 4:
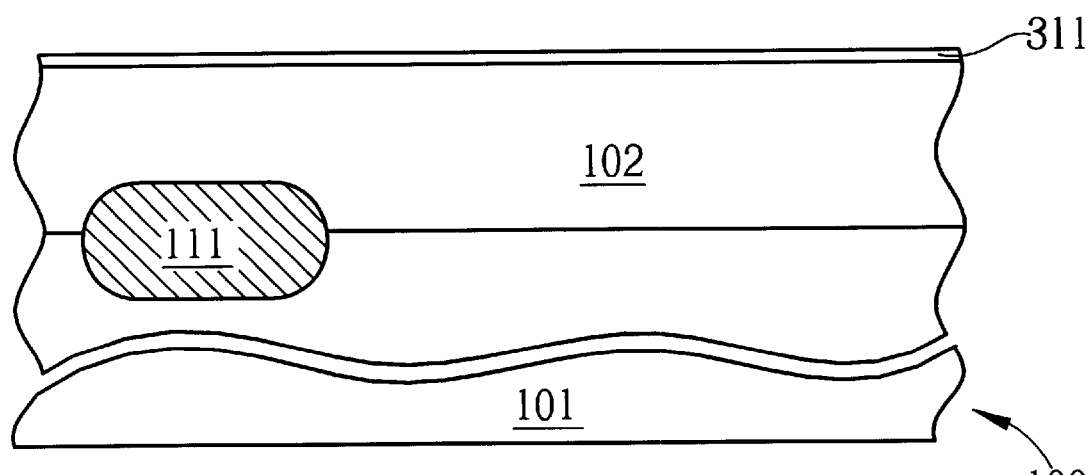

Next, as shown in FIG. 4, the photo-resist layer 302 is stripped and the silicon oxide layer 301 is removed. After a series of carefully performed cleaning processes and drying processes, an epitaxial growth process is performed to form the P-type epitaxial layer 102, with a thickness greater than 10 micrometers and a doping concentration of about $5.0 \times 10^{14}$ to $3.0 \times 10^{15}$ atoms/cm$^3$, on the surface of the silicon substrate 101. The epitaxial growth process is performed using a gas mixture of silicon tetrachloride ($SiCl_4$), hydrogen, and diborane ($B_2H_6$) at an operating temperature of over 1000° C. During the epitaxial growth process, the dopants in the doping region 111a are driven upward into the P-type epitaxial layer 102, and downward into the silicon substrate 101, forming the diffused region 111 with a doping concentration of about $5.0 \times 10^{17}$ to $1.0 \times 10^{19}$ atoms/cm$^3$. A dry-wet-dry (DWD) oxidation process is then performed in an oxygenated environment at a temperature of about 900° C. to 1000° C. to form a silicon oxide layer 311 on the surface of the silicon substrate 101. The silicon oxide layer 311 has a thickness of about 100 to 300 angstroms.

Figure 5:
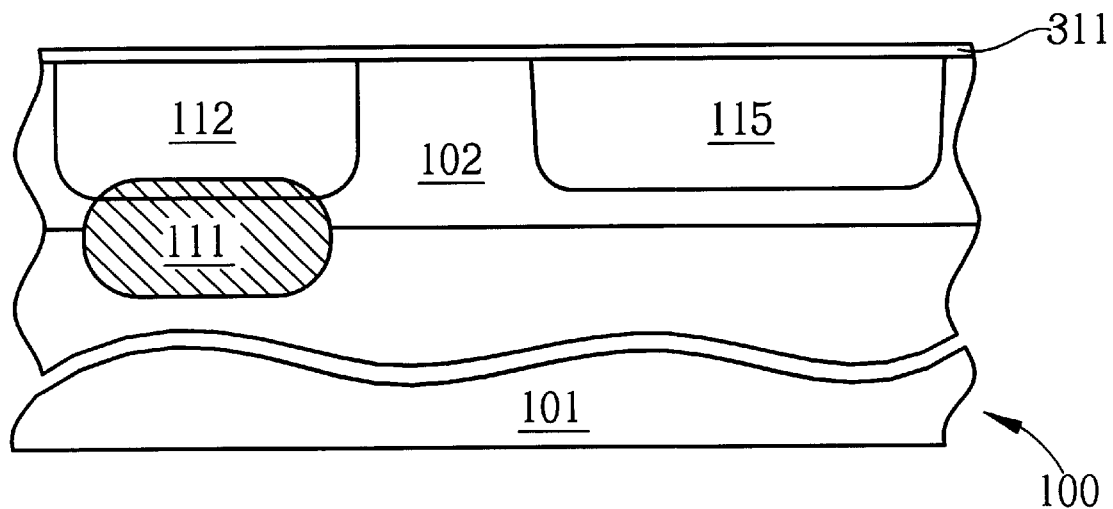

Next, as shown in FIG. 5, using a conventional lithographic process and a boron ion implantation process, the P-well region 112 is formed within the epitaxial layer 102 with a doping concentration of about $5.0 \times 10^{15}$ to $7.0 \times 10^{16}$ atoms/cm$^3$. The N-drain well 115 is subsequently formed within the epitaxial layer 102 with a doping concentration of about $3.0 \times 10^{15}$ to $2.0 \times 10^{16}$ atoms/cm$^3$ using a conventional lithographic process and a phosphorus ion implantation process. Thereafter, rapid thermal processing (RTP) is used to form an overlap of the P well region 112 and the diffused region 111.

Figure 6:
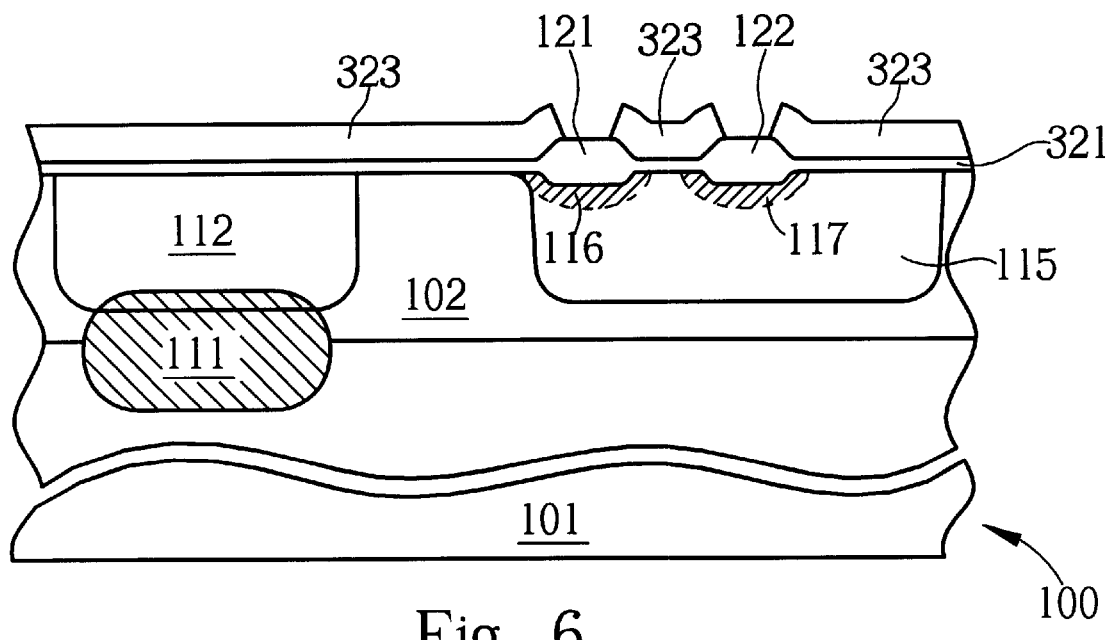

Next, as shown in FIG. 6, a wet etching process is performed using a solution containing hydrofluoric acid (HF) to remove the silicon oxide layer 311. Then, a series of cleaning processes and drying processes are carefully performed. A silicon oxide layer 321, with a thickness of about 65 to 300 angstroms, is next formed on the surface of the epitaxial layer 102 using an oxidation process. A silicon nitride layer 323 is formed over the silicon oxide layer 321 using a low-pressure chemical vapor deposition (LPCVD) process. The LPCVD process is performed in a gas mixture of dichlorosilane ($SiH_2Cl_4$) and ammonia with a pressure of about 0.1 to 1 torr at a temperature of about 700° C. to 800° C. A conventional lithographic process and a dry etching process are sequentially performed to form the patterned silicon nitride layer 323. An arsenic ion implantation process is next performed, using the patterned silicon nitride layer 323 as a hard mask, to form the two N-doping regions 116 and 117 within the N-drain well 115 on the surface of the epitaxial layer 102. The doping concentration of the two N doping regions 116 and 117 is about $3.0 \times 10^{15}$ to $3.0 \times 10^{17}$ atoms/cm$^3$. Field oxide layers 121 and 122 are then formed using an oxidation process on the silicon oxide layer 321 above the doping regions 116 and 117, respectively. The doping regions 116 and 117 are contiguous with their respective field oxide layers 121 and 122.

Figure 7:
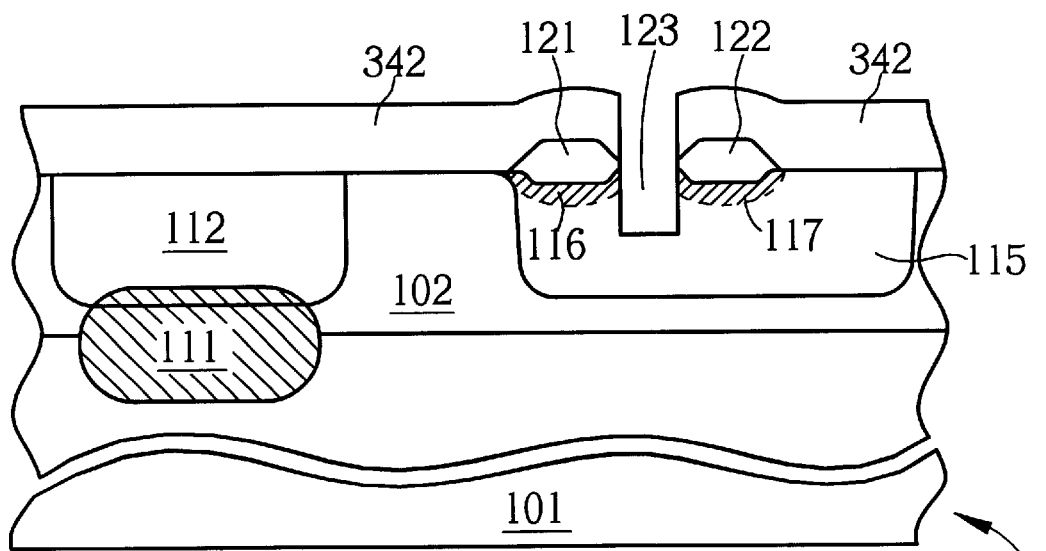

Next, as shown in FIG. 7, both the silicon nitride layer 323 and the silicon oxide layer 321 are removed. A hot phosphoric acid solution at a temperature of about 150° C. is used to remove the silicon nitride layer 323. Hydrofluoric acid is used to remove the silicon oxide layer 321. A trench pattern between the field oxide layers 121 and 122 is then defined in a photo-resist layer 342 using a conventional lithographic process. Thereafter, a dry etching process is performed to form the shallow trench 123, with a depth of about 0.4 to 1.0 micrometers, in the epitaxial layer 102. The distance between the two field oxide layers is about 0.2 to 50 micrometers.

Figure 8:
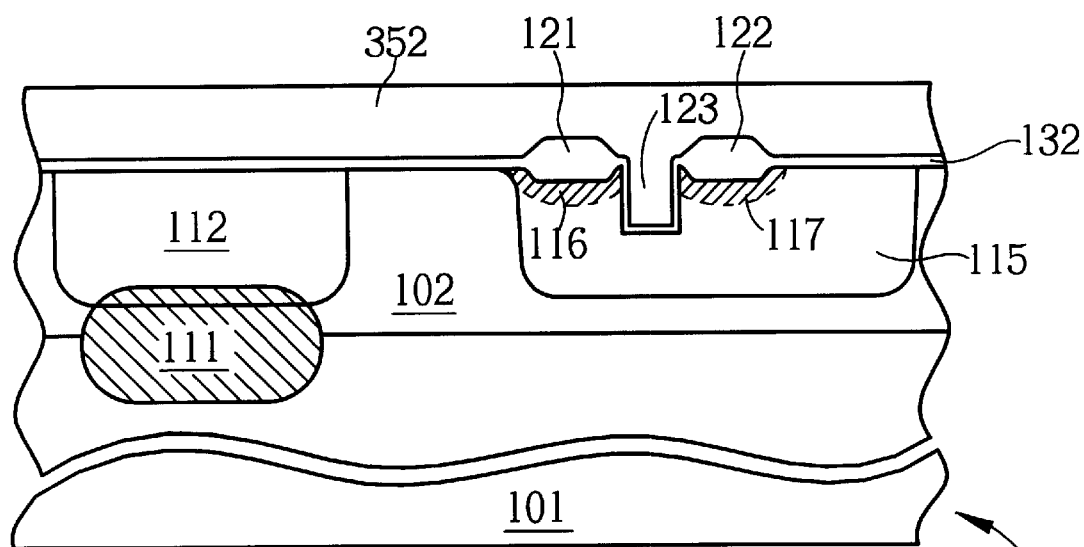

Next, as shown in FIG. 8, the photo-resist layer 342 is removed. An oxidation process is then performed to form a gate oxide layer 132, with a thickness of about 100 to 500 angstroms, on the surface of the epitaxial layer 102. An atmospheric pressure chemical vapor deposition (APCVD) process is next performed to deposit a silicon dioxide layer 352, with a thickness of about 5000 to 9000 angstroms, that fills the shallow trench 123.

Figure 9:
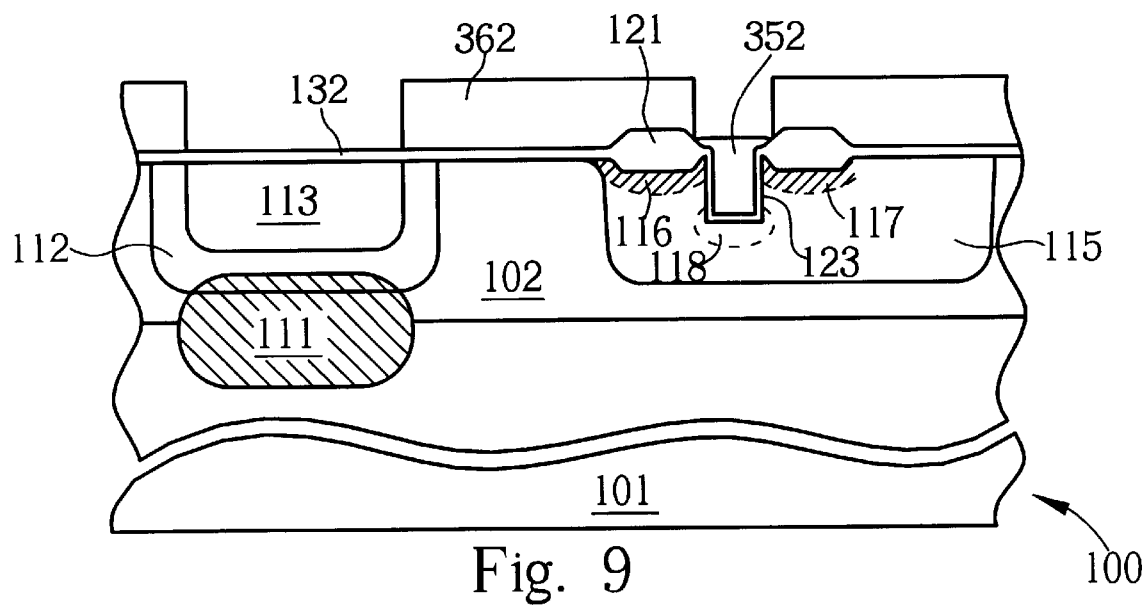

As shown in FIG. 9, using a chemical mechanical polishing (CMP) process, the silicon dioxide layer 352 is polished and removed down to the surface of the gate oxide layer 122. The P-well region 113 within the P-well region 112, and the P-doping region 118 that is contiguous with and under the shallow trench 123, are formed using an ion implantation process and a patterned photo-resist layer 362 as a hard mask. The doping concentration of the P-well region 113 is about $1.0 \times 10^{16}$ to $7.0 \times 10^{17}$ atoms/cm$^3$ and the P-doping region 118 is about $8.0 \times 10^{15}$ to $7.0 \times 10^{17}$ atoms/cm$^3$. The photo-resist layer 362 is then completely removed.

Figure 10:
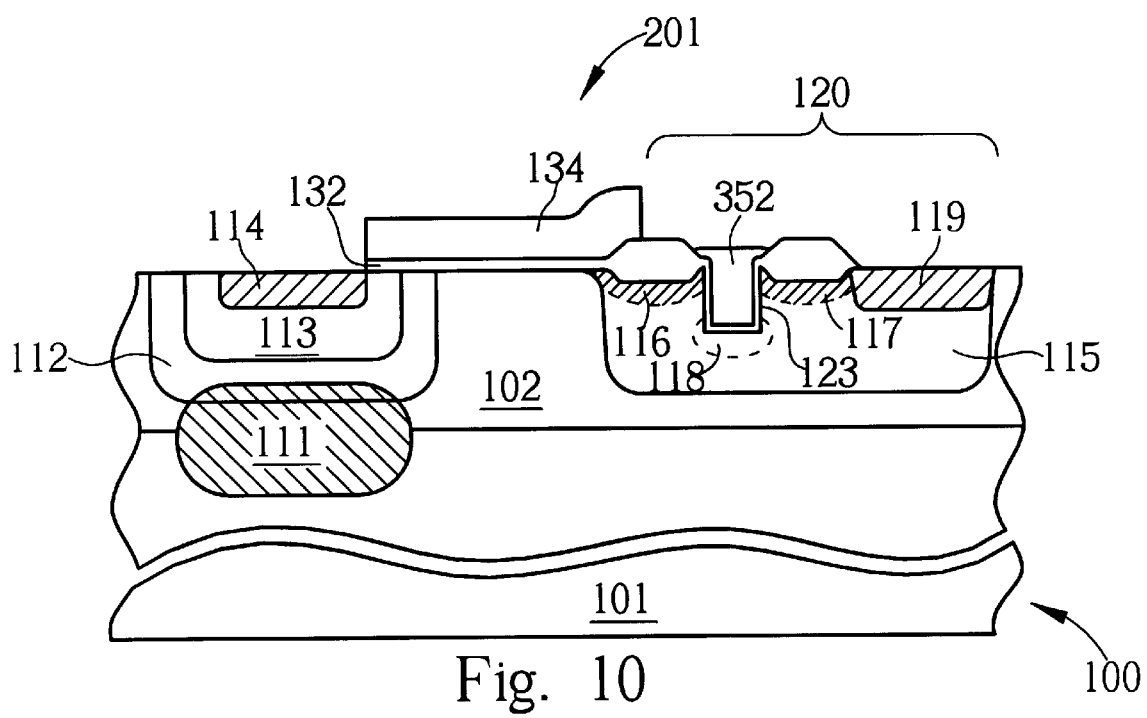

Finally, as shown in FIG. 10, a polysilicon layer is formed on the surface of the gate oxide layer 132. A conventional lithographic process and a dry etching process are used to define the gate 134 between the P-well region 113 and the N-drain well 115. An ion implantation process is then performed to form a source region 114 within the P-well region 113, and to form the N-doping region 119 within the N-drain well 115 on the surface of the epitaxial layer 102, thereby completing the HVMOS transistor 201.

In contrast to the HVMOS transistor according to the prior art method, the present invention provides the structure of the HVMOS transistor 201 with the P-well region 113 within the P-well region 112, and the diffused region 111 overlapping the P-well region 112. The P-well region 113 enhances the lateral electric field along the channel below the gate 134 by altering the doping concentration of the P-well region 113, and thus enhancing the channel conductance as well as improving current drifting capabilities.

In addition, the HVMOS transistor 201 according to the present invention provides the diffused region 111 that overlapping with the P-well region 113. The diffused region 111 reduces the effective resistance of the silicon substrate 101, and thus reduces snapback effects and the parasitic bipolar transistor phenomenon. The P-doping region 118 below the shallow trench 123 creates a depletion region with a larger width so as to increase the breakdown voltage of the drain 120.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A high-voltage metal-oxide-semiconductor (HVMOS) transistor on a semiconductor wafer, the semiconductor wafer comprising a silicon substrate of a first conductivity type and an epitaxial layer of a second conductivity type having a first predetermined doping concentration formed on the surface of the silicon substrate, the HVMOS transistor comprising:
   a first well region of the second conductivity type formed within the epitaxial layer, the first well region having a second predetermined doping concentration greater than the first predetermined doping concentration;
   a second well region of the second conductivity type formed within the first well region, the second well region having a third predetermined doping concentration greater than the second predetermined doping concentration;
   a source region of the first conductivity type formed within the second well region of the epitaxial layer;
   a drain region of the first conductivity type formed in the epitaxial layer;
   a gate located between the source region and the drain region on the surface of the epitaxial layer; and
   a diffused region of the second conductivity type formed both in the epitaxial layer and in the silicon substrate, the diffused region of the second conductivity type being under the first well region and overlapping with the first well region.

2. The HVMOS transistor of claim 1 wherein the thickness of the epitaxial layer is greater than 10 micrometers.

3. The HVMOS transistor of claim 1 wherein the first conductivity type is an N type while the second conductivity type is a P type.

4. The HVMOS transistor of claim 1 wherein the first conductivity type is a P type while the second conductivity type is an N type.

5. The HVMOS transistor of claim 1 wherein the doping concentration of the first well region is about $5.0 \times 10^{15}$ to $7.0 \times 10^{16}$ atoms/cm$^3$, the doping concentration of the second well region is about $1.0 \times 10^{16}$ to $7.0 \times 10^{17}$ atoms/cm$^3$, and the doping concentration of the epitaxial layer is about $5.0 \times 10^{14}$ to $3.0 \times 10^{15}$ atoms/cm$^3$.

6. The HVMOS transistor of claim 1 wherein the doping concentration of the diffused region is about $5.0 \times 10^{17}$ to $1.0 \times 10^{19}$ atoms/cm$^3$.

7. The HVMOS transistor of claim 1 wherein the diffused region overlaps with the first well region and the second well region.

8. The HVMOS transistor of claim 1 wherein the drain region comprises:
   a first conductivity type drain well formed on the surface of the epitaxial layer;
   a first and a second field oxide layer formed within the first conductivity type drain well on the surface of the epitaxial layer;
   a first and a second first conductivity type doping region formed under the first and the second field oxide layers, respectively, the doping regions being contiguous with their respective field oxide layers;
   a shallow trench filled with a dielectric material, the shallow trench formed between the first field oxide layer and the second field oxide layer on the surface of the epitaxial layer;
   a second conductivity type doping region formed under the shallow trench being contiguous with the shallow trench; and
   a third first conductivity type doping region formed within the first conductivity type drain well on the surface of the epitaxial layer, the third first conductivity type doping region being adjacent to the second field oxide layer.

9. The HVMOS transistor of claim 8 wherein the distance between the first and the second field oxide layers is about 0.2 to 50 micrometers, and the depth of the shallow trench is about 0.4 to 1.0 micrometers.

10. The HVMOS transistor of claim 8 wherein the doping concentration of the third first conductivity type doping region is greater than that of the first conductivity type drain well.

11. The HVMOS transistor of claim 8 wherein the doping concentration of the first first conductivity type doping region is about $3.0 \times 10^{15}$ to $2.0 \times 10^{16}$ atoms/cm$^3$, the doping concentration of the second first conductivity type doping region is about $8.0 \times 10^{15}$ to $3.0 \times 10^{17}$ atoms/cm$^3$, and the doping concentration of the second conductivity type doping region is about $8.0 \times 10^{15}$ to $7.0 \times 10^{17}$ atoms/cm$^3$.

12. The HVMOS transistor of claim 8 wherein the dielectric material is silicon dioxide.

13. A high-voltage metal-oxide-semiconductor (HVMOS) transistor that reduces snap-back phenomenon, the HVMOS transistor formed on a semiconductor wafer, the semiconductor wafer comprising a silicon substrate and a P-type epitaxial layer having a first predetermined doping concentration formed on the surface of the silicon substrate, the HVMOS transistor comprising:

a first P well region formed within the P-type epitaxial layer, the first P well having a second predetermined doping concentration greater than the first predetermined doping concentration;

a second P well region formed within the first P well region, the second P well region having a third predetermined doping concentration greater than the second predetermined doping concentration;

a source formed within the second P well region;

a drain formed within the P-type epitaxial layer;

a gate located between the source and the drain on the surface of the epitaxial layer; and a P-type diffused region formed in the epitaxial layer and in the silicon substrate, the P-type diffused region being under the first well region and overlapping with the first well region;

wherein the P-type diffused region reduces effective resistance of the silicon substrate, thus reducing snapback and parasitic bipolar transistor phenomenon.

14. The HVMOS transistor of claim 13 wherein the silicon substrate is an N-type silicon substrate.

15. The HVMOS transistor of claim 13 wherein the thickness of the P-type epitaxial layer is greater than 10 micrometers.

16. The HVMOS transistor of claim 13 wherein the P-type diffused region overlaps with the first P well region and the second P well region.

17. The HVMOS transistor of claim 13 wherein the doping concentration of the first P well region is about $5.0 \times 10^{15}$ to $7.0 \times 10^{16}$ atoms/cm$^3$, the doping concentration of the second P well region is about $1.0 \times 10^{16}$ to $7.0 \times 10^{17}$ atoms/cm$^3$, and the doping concentration of the P-type epitaxial layer is about $5.0 \times 10^{14}$ to $3.0 \times 10^{15}$ atoms/cm$^3$.

18. The HVMOS transistor of claim 13 wherein the drain comprises:

an N well formed on the surface of the P-type epitaxial layer;

a first and a second field oxide layer formed within the N well on the surface of the P-type epitaxial layer;

a first N-type region and a second doping region formed under the first and the second field oxide layers, respectively, and being contiguous with their respective field oxide layers;

a shallow trench filled with silicon dioxide, the shallow trench formed between the first field oxide layer and the second field oxide layer on the surface of the P-type epitaxial layer;

a P-type doping region formed under the shallow trench being contiguous with the shallow trench; and a third N-type doping region formed within the N well on the surface of the epitaxial layer, the third N-type doping region being adjacent to the second field oxide layer.

19. The HVMOS transistor of claim 18 wherein the doping concentration of the third N-type doping region is greater than that of the N well.

* * * * *